US006906663B2

(12) United States Patent  
Johnston (10) Patent No.: US 6,906,663 B2  
(45) Date of Patent: Jun. 14, 2005

(54) E-FIELD MONITOR FOR PULSED SIGNALS

(75) Inventor: Gary P. Johnston, Kent, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/779,016

(22) Filed: Feb. 13, 2004

(65) Prior Publication Data

US 2005/0104768 A1 May 19, 2005

Related U.S. Application Data

(63) Continuation-in-part of application No. 10/630,252, filed on Jul. 30, 2003, now abandoned.

(51) Int. Cl.[7] ................................. G01S 7/40
(52) U.S. Cl. ..................... 342/173; 342/192; 342/175; 324/76.11; 324/76.19
(58) Field of Search .................... 342/165, 173–175, 342/188, 189, 192, 195, 196, 13; 324/76.11, 76.19, 76.26

(56) References Cited

U.S. PATENT DOCUMENTS

| | | | | | |
|---|---|---|---|---|---|
| 4,859,933 | A | * | 8/1989 | Taylor et al. | 324/76.29 |
| 6,122,040 | A | * | 9/2000 | Arita et al. | 356/4.01 |
| 2002/0042257 | A1 | * | 4/2002 | Sorrells et al. | 455/313 |
| 2003/0078730 | A1 | * | 4/2003 | Sekiguchi | 701/301 |
| 2003/0088361 | A1 | * | 5/2003 | Sekiguchi | 701/301 |
| 2003/0097237 | A1 | * | 5/2003 | Sekiguchi | 702/158 |
| 2003/0232612 | A1 | * | 12/2003 | Richards et al. | 455/323 |
| 2004/0054473 | A1 | * | 3/2004 | Shimomura | 701/301 |
| 2004/0080449 | A1 | * | 4/2004 | Horibe | 342/70 |

OTHER PUBLICATIONS

"Universal sensor using electro–optic sensing principles", Mailand, M.; Daout, B.;Ultra–Wideband Short–Pulse Electromagnetics 4, 1998, Jun. 14–19, 1998 pp.: 49–56.*

* cited by examiner

Primary Examiner—John B. Sotomayor  
(74) Attorney, Agent, or Firm—Harness Dickey & Pierce P.L.C.

(57) ABSTRACT

A system is provided for substantially continuously monitoring an electromagnetic intensity of short pulses of electromagnetic fields (E-fields) having frequencies within a broad frequency range. The system includes at least one antenna capable of sensing one or more pulses of E-fields and converting the pulses into radio frequency (RF) signals having an energy level correlated to the intensities of the E-fields. The system additionally includes at least one equalizer that normalizes the energy levels of RF signals across the broad range of frequencies and at least one modulation device that adjusts the energy levels of the RF signals output by the equalizer. The system further includes at least one RF power sensor for periodically measuring the energy levels of the RF signals output from the modulation device. Further yet, the system includes at least one power meter that determines the peak power level of at least one peak RF signal that has the highest energy level and converts the peak power level of the peak RF signal to power units. Still further yet, the system includes a computer based device that utilizes the power units output by the peak power measurement subsystem to determine the intensity of the E-field correlated with the peak RF signal as sensed by the antenna.

46 Claims, 3 Drawing Sheets

E-FIELD MONITOR FOR PULSED SIGNALS

CROSS REFERENCE TO RELATED APPLICATIONS

This application is a continuation-in-part of U.S. patent application Ser. No. 10/630,252 filed on Jul. 30, 2003 now abandoned. The disclosure of the above application is incorporated herein by reference.

STATEMENT OF GOVERNMENT RIGHTS

This invention was developed at least in part pursuant to Contract No. F04701-97-C-0004, with the U.S. Air Force. The U.S. Government has certain rights in this invention.

FIELD OF THE INVENTION

The present invention relates to narrow pulsed electromagnetic fields, or waves, generated by known electromagnetic wave emitters, such as radars. More specifically, the invention relates to a system for sensing the presence of such electromagnetic fields near electronic equipment that is vulnerable to anomalies caused by the electromagnetic fields.

BACKGROUND OF THE INVENTION

Various known electromagnetic wave emitters, such as radars, emit narrow pulsed electromagnetic fields (E-fields), also referred to in the art as electromagnetic waves (E-waves), over a very broad frequency range. These E-fields can potentially cause electronic interference with and/or corruption of electronic equipment exposed lo the E-fields. More specifically, the greater the intensity of the. E-fields, the greater the potential to cause interference and/or corruption of exposed electronic equipment. It is therefore highly desirable to know when E-fields occur so that diagnosis of anomalies in exposed electronic equipment can include E-field interference as a possible cause or contributor of the anomaly. Known systems, of moderate complexity and expense, for sensing E-fields generally can not continuously capture and measure all narrow pulsed electromagnetic emissions, e.g. pulses having a duration of equal to or greater than 300 nsec, and multiple emitters operating over a broad frequency range, e.g. 1 to 10 GHz. For example, some known systems can only sample the E-field environment and consequently miss many narrow pulses and/or they are unable to adequately sense narrow pulses over a broad frequency range. Some known systems of high complexity and expense are capable of continuously capturing and measuring all narrow pulsed emissions. However, the expense of these systems often precludes acquisition of such systems.

Therefore, a system to sense, measure and record the occurrence and intensity of single or multiple narrow pulsed E-fields having frequencies anywhere within a very broad frequency range is desirable. Additionally, it is desirable for such a system to be of low to moderate expense and complexity.

SUMMARY OF THE INVENTION

In one preferred embodiment of the present invention a system is provided for substantially continuously monitoring the electromagnetic intensity of narrow pulsed electromagnetic fields (E-fields) having frequencies within a very broad frequency range. The system includes at least one antenna capable of sensing one or more pulses of E-fields and converting the pulses into radio frequency (RF) wave signals having an energy level and frequency correlated to the intensities and frequencies of the E-fields. The system additionally includes at least one equalizer that normalizes the energy levels of RF signals across a range of frequencies. The system further includes at least one modulation device that adjusts the energy levels of the RF signals output by the equalizer. Further yet, the system includes at least one power sensor for periodically measuring the energy levels of the RF signals. Still further, the system includes at least one power meter that determines the peak power level of at least one peak RF signal that has the highest energy level and converts the output of the power sensor into power units. The power meter communicates the power measurements to a computer based device that converts the power measurements to E-field units that indicate the intensity of the E-fields, as sensed by the antenna. If the intensity of the E-field correlating to the peak RF signal exceeds a predetermined limit, the time and intensity of the E-field is recorded by the computer based device.

In another preferred embodiment of the present invention a method is provided for substantially continuously monitoring the electromagnetic intensity of narrow pulsed electromagnetic fields within a very broad frequency bandwidth. The method includes substantially continuously sensing one or more E-fields within a range of frequencies utilizing at least one antenna capable of receiving E-fields. The method additionally includes converting the E-fields into RF signals having energy levels and frequencies correlated to intensities and frequencies of the E-fields. Furthermore, the method includes determining the peak power level of at least one peak RF signal having the highest energy level utilizing at least one peak power measurement subsystem. The peak power level of the peak RF signal is then converted to power units utilizing the peak power measurement subsystem. The method further includes calculating the intensity of the E-field correlated with the peak RF signal based on the power units output by the peak power measurement subsystem. Any E-field intensity exceeding a predetermined level is then time tagged and recorded by the computer based device.

Further areas of applicability of the present invention will become apparent from the detailed description provided hereinafter. It should be understood that the detailed description and specific examples are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE INVENTION

The description of the invention below is merely exemplary in nature and, thus, variations that do not depart from the gist of the invention are intended to be within the scope of the invention. Such variations are not to be regarded as a departure from the spirit and scope of the invention.

Figure 1:
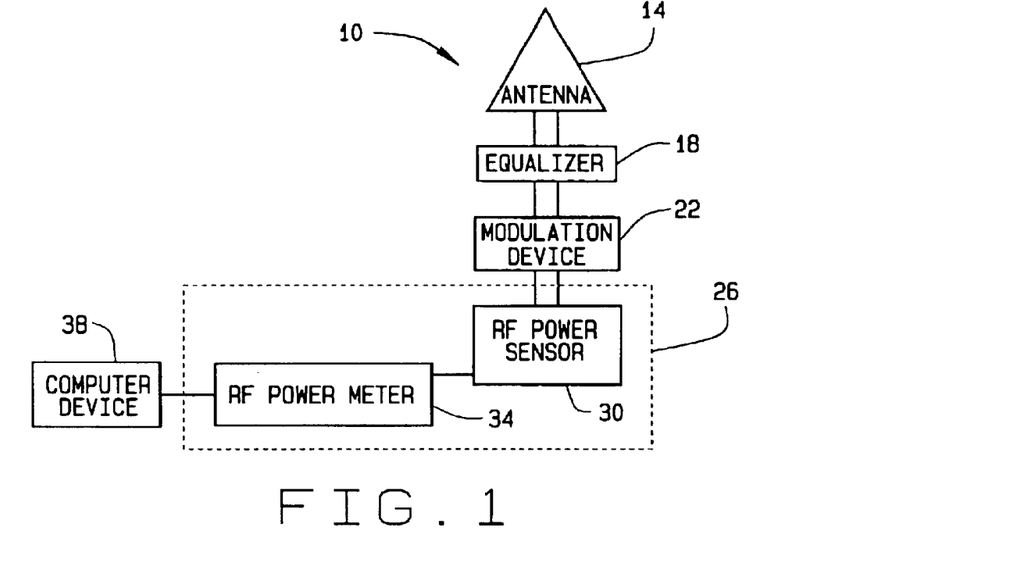
FIG. 1 is a block diagram of an E-field monitoring system, in accordance with a preferred embodiment of the present invention.

FIG. 1 is a block diagram of an E-field monitoring system 10, in accordance with a preferred embodiment of the present invention. The system 10 includes an antenna 14 that senses one or more electromagnetic fields (E-fields), also referred to as electromagnetic waves (E-waves), within a very broad frequency range. The antenna 14 converts the E-fields into signals, referred to herein as radio frequency (RF) signals. The RF signals output by the antenna 14 have substantially the same frequency as the E-fields sensed by the antenna 14. Thus, although the signals output by the antenna 14 are referred to herein as RF signals, it should be understood that the frequencies of the RF signals are substantially equal to the frequencies of the E-fields sensed. For example, in a preferred form, the antenna 14 is capable of sensing E-fields having frequencies ranging from 50 KHz to 300 GHz. Therefore, the RF signals output by the antenna 14 will have frequencies ranging from 50 KHz to 300 GHz. In another preferred form, the antenna 14 is capable of sensing E-fields having frequencies within a range of 500 MHz to 20 GHz, preferably 1 GHz to 12 GHz . Therefore, the RF signals output by the antenna 14 will have frequencies within a the range of 500 MHz to 20 GHz, preferably 1 GHz to 12 GHz Additionally, the RF signals will have the same characteristics, e.g. relative intensities, durations and shapes, as the E-fields sensed by the antenna 14. In a preferred form, the antenna 14 is an omni-directional antenna, however, antenna 14 can be any antenna suitable for sensing narrow pulsed E-fields with a broad frequency range. For example, antenna 14 can be a uni-directional antenna if it is desirable to sense E-fields from only one direction. Additionally, the antenna 14 can be selected to sense any polarization of E-fields, e.g. linear, circular or elliptical, based on the specific application of system 10. Thus, the choice of antenna 14 depends on the direction and polarization of the E-fields desired to be monitored and can be changed to suit any specific application.

The E-fields are received by the antenna 14 that converts the E-fields to RF signals having energy levels that correlate to the intensity/strength of the E-fields. However, the effective aperture of the antenna 14 decreases as the frequency of the E-fields increase, resulting in reduced output energy levels of the higher frequency E-fields received by the antenna 14. That is, as the frequencies of the E-fields increase the antenna 14 has less ability to convert the E-field intensity into an RF signal energy level. For example, if the antenna 14 senses two E-fields having the same intensity, but one E-field has a frequency of 1 GHz and the other E-field has a frequency of 12 GHz, the RF signal output by the antenna 14 relating to the 12 GHz E-field will have a lesser energy level than the RF signal output by the antenna 14 relating to the 1 GHz E-field.

The antenna 14 outputs the RF signals to an equalizer 18, preferably a broadband equalizer. To compensate for the reduction of the energy levels due to the decreasing aperture of antenna 14 with increasing frequencies, the equalizer 18 normalizes the energy levels over all frequencies of the RF signals output by the antenna 14. More specifically, since the antenna 14 will not convert as much E-field intensity into an RF signal energy level at higher frequencies, due to the decreasing aperture, the equalizer 18 compensates for the loss of energy output from the antenna 14 as the frequencies increase. Therefore, elaborating on the example above, since the 1 GHz E-field and the 12 GHz E-field are sensed by the antenna to have the same intensity, the equalizer 18 will normalize the RF signals output by the antenna 14 such that an RF signal output by the equalizer 18 relating to the 1 GHz E-field will have the same energy level as an RF signal output by the equalizer 18 relating to the 12 GHz E-field. As a further example, if the antenna 14 senses two E-fields of different frequencies with intensities having a 1 to 10 ratio, the equalizer will normalize the RF signals output by the antenna 14 so that the energy levels of the RF signals output by the equalizer 18 have the appropriate 1 to 10 ratio. That is, if the antenna 14 senses a 1 GHz E-field having an intensity of 1 Volt/meter and a 12 GHz E-field having an intensity of 10 Volts/meter, i.e. a 1 to 10 ratio, the RF signals output by the antenna 14 will not maintain the same 1 to 10 ratio due to the decrease in effective aperture caused by the 10 GHz E-field. Accordingly, the equalizer 18 will normalize the two RF signals output by the antenna 14 so that the power levels of the two respective RF signals output by the equalizer 18 have the appropriate 1 to 10 ratio.

Furthermore, the equalizer 18 can contain compensation for frequency response variations in a modulation device 22, an RF power sensor 30, and the interconnections, e.g. coaxial cables, between the antenna 14, the equalizer 18, the modulation device 22 and the RF power sensor 30.

The system 10 further includes the modulation device 22 and a peak power measurement subsystem 26. The pulsed RF signals output by the equalizer 18 are adjusted/modulated, e.g. amplified or attenuated, by the modulation device 22 to a level compatible with the peak power measurement subsystem 26. The modulation device 22 can be any device suitable to modulate the energy level of the pulsed signals, for example, an amplifier, an attenuator, or a device capable of both amplifying and attenuating the signals. Thus, the modulation device 22 enables the monitoring system 10 to sense and monitor very weak to very strong E-fields. The peak power measurement subsystem 26 is capable of measuring RF signals having very short durations. The peak power measurement subsystem 26 measures the energy levels of the RF signals output by the modulation device 22 and determines peak power levels of the signals. Specifically, the power measurement subsystem determines the peak power level of at least one peak RF signal having the highest energy level. Additionally, the peak power measurement subsystem 26 measures the shape and duration of each pulsed RF signal. The peak power measurement subsystem 26 then converts power levels of the signals, including the peak RF signal, into power units, e.g. Watts, and relative times.

The peak power measurement subsystem 26 then communicates the power value, shape and duration of the peak RF signal and the other signals to a computer based device 38. The computer based device then converts the power values, via calculations, to E-field intensity units, e.g. Volts/meter, that correlate to the RF signals as sensed by the antenna 14.

The computer based device 38 then determines whether the E-field intensity of any of the RF signals, specifically at least the peak RF signal, exceeds a predetermined level. The predetermined level is settable via the computer based device 38 and relates to a maximum level of E-field energy that is desired to be allowed within a particular environment where electronic equipment is being used. That is, E-fields having intensities less than the maximum level are thought to have little or no potential for causing interference and/or corruption of electronic equipment exposed to the E-fields. E-fields having intensities that exceed the maximum level are recorded and stored via the computer based device for future retrieval and/or reference. Alternatively, the intensities, shapes and/or durations of some or all the E-fields sensed by the antenna 14 can be time tagged, recorded and stored, and the E-field intensities that exceed the maximum level can be flagged.

The peak power measurement subsystem 26 can communicate with the computer based device 38 via a direct connection, i.e. hardwired, or via a wireless connection, e.g. infrared, wireless modem, or other wireless means. The computer based device 38 can be any device that generally includes a processor and memory suitable for executing software suitable for performing the necessary calculations for converting RF power into an E-field intensity level and storing the results. For example, the computer based device 38 can be a desktop computer, a laptop computer or a hand held computing device.

In one preferred embodiment, the peak power measurement subsystem 26 includes the RF power sensor 30 and an RF power meter 34. The RF power sensor 30 makes multiple time displaced, i.e. periodic, power measurements of each pulsed RF signal output from the modulation device 22. The output of the RF power sensor 30 is input to the RF power meter 34. The RF power meter 34 determines the peak power level of any or all the RF signals, specifically of at least the RF signal having the highest energy level, i.e. the peak RF signal. Additionally, the power meter 34 measures the shape and duration of each pulsed RF signal. The power meter 34 then converts power levels of the signals, including the peak RF signal, into power units, e.g. Watts, and relative times.

It is envisioned that the monitoring system 10 can be either a stationary system or a portable system. For example, the monitoring system 10 could be a stationary system wherein the antenna 14 is fixed to a stationary base and the equalizer 18, the modulation device 22, the peak power measurement subsystem 26 and the computer based device 38 are placed on a substantially stationary fixture, such as an equipment rack. Conversely, the antenna 14 could be mounted to a movable cart and the equalizer 18, the modulation device 22, the peak power measurement subsystem 26 and the computer based device 38 could be placed on shelves of the movable cart. Thus, the monitoring system would be portable such that it could be utilized to sense and monitor E-fields at various locations within any environment.

Figure 2:
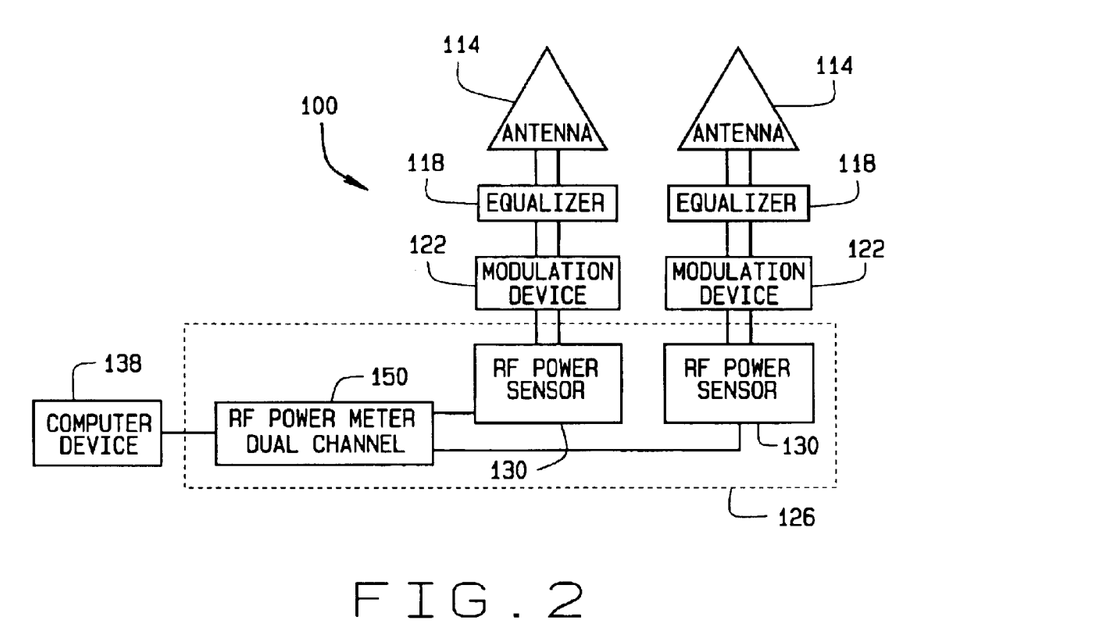
FIG. 2 is a block diagram of a preferred alternate embodiment of the system shown in FIG. 1.

FIG. 2 is a block diagram of a preferred alternate embodiment of the E-field monitoring system 10, shown in FIG. 1. For clarity, the E-field monitoring system shown in this alternate embodiment will be referred to herein as monitoring system 100. Additionally, for clarity, all components in FIG. 2 that are identical to components in FIG. 1 will be identified in FIG. 2 using the reference numbers shown in FIG. 1 increased by one hundred. The monitoring system 100 includes a plurality of antennas 114. Each antenna 114 and system components associated therewith, as described below, are referred to as a channel. For example, if the monitoring system 100 included two antennas 114, the monitoring system 100 would be referred to as including two channels. However, if the monitoring system 100 included four antennas 114, the monitoring system 100 would be referred to as including four channels.

For clarity, the monitoring system 100 described will be described herein as including two antennas 114 and two of each associated system component. Thus, the embodiment of the monitoring system 100 illustrated in FIG. 2 includes two channels. The two antennas 114 increase the number and character of E-fields that the monitoring system 100 can sense. Accordingly, the monitoring system 100 also includes two equalizers 118 to normalize the RF signals output by the antennas 114 and two modulation devices 122 to adjust the energy levels of the RF signals output by the equalizers 118. It should be understood that the antennas 114, the equalizers 118 and the modulation devices 122 are identical in form and function as the antenna 14, the equalizer 18 and the modulation device 22 described above in reference to FIG. 1.

The peak power measurement subsystem 126 further includes two RF power sensors 130. Each of the RF power sensors 130 is identical in form and function to the RF power sensor 30 described above in reference to FIG. 1. Thus, each RF power sensor 130 makes multiple time displaced, i.e. periodic, power level measurements of each pulsed RF signal output from the respective modulation device 122. It should be understood that each of the two channels illustrated in FIG. 2 includes an antenna 114 and an associated equalizer 118, modulation device 122 and power sensor 130.

The output of each RF power sensor 130 is input to a dual channel RF power meter 150. Each channel of the RF power meter 150 independently determines the peak power level of any or all the RF signals input from the respective power sensor 130. Specifically, each channel of the dual channel RF power meter 150 independently determines the peak power level of at least the RF signal input from the respective power sensor 130 having the highest energy level, i.e. the peak RF signal. Additionally, the power meter 150 measures the shape and duration of each pulsed RF signal received. The power meter 150 then converts power levels of the signals, including the peak RF signals, into power units, e.g. Watts, and relative times.

These values are then output to the computer based device 138, which is identical in form and function as the computer based device 38 described above in reference to FIG. 1. In a preferred embodiment the antennas 114 are two circular polarized, hemispherical antennas. For example, one antenna 114 is a left hand circular polarized hemispherical antenna and the other antenna 114 is a right hand circular polarized hemispherical antenna. Therefore, the monitoring system 100 would be capable of sensing all polarizations or E-fields in a hemisphere. However, any combination of antenna polarizations can be selected depending on the specific application.

In one preferred embodiment, the antenna 114, equalizer 118, modulation device 122 and RF power sensor 130 in one channel operate over a higher frequency range than does the same components in the other channel. This increases the overall frequency range that the monitoring system 100 can sense. For example, in this form, the monitoring system 100 can sense E-fields having frequencies with a 1 to 18 GHz range.

Figure 3:
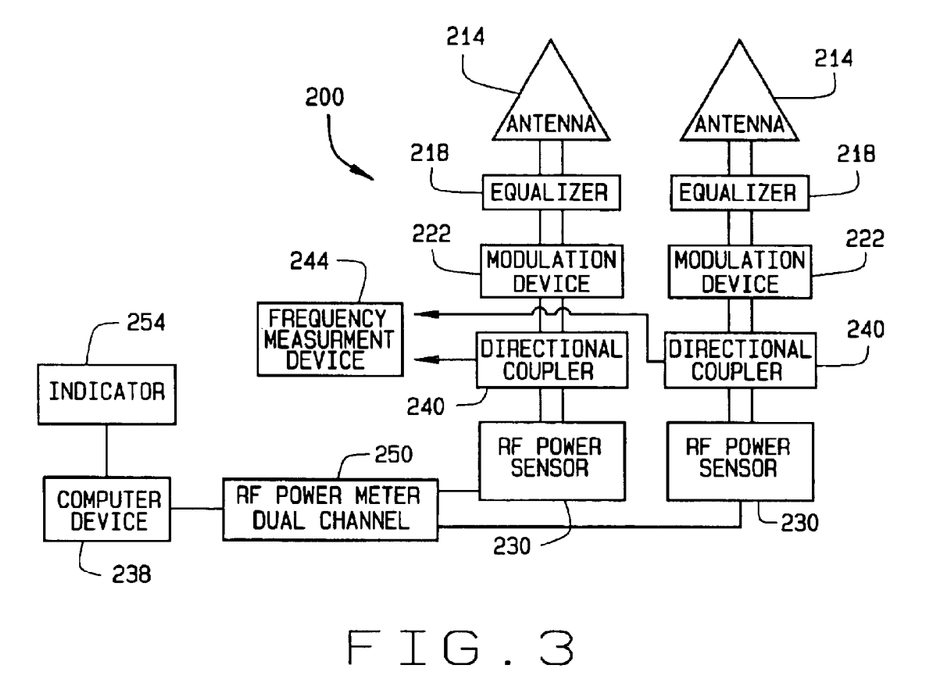
FIG. 3 is a block diagram of another preferred alternate embodiment of the system shown in FIG. 1.

FIG. 3 is a block diagram of another preferred alternate embodiment of the E-field monitoring system 10, shown in FIG. 1. For clarity, the E-field monitoring system shown in this alternate embodiment will be referred to herein as monitoring system 200. Additionally, for clarity, all components in FIG. 3 that are identical to components in FIG. 1 will be identified in FIG. 3 using the reference numbers shown in FIG. 1 increased by two hundred. As in the monitoring system 100, shown if FIG. 2, the monitoring system 200 includes two channels. The two antennas 214 increase the number and character of E-fields that the monitoring system 200 can sense. Accordingly, the monitoring system 200 also includes two equalizers 218 to normalize the RF signals output by the antennas 214 and two modulation devices 222 to adjust the energy levels of the RF signals output by the equalizers 218. It should be understood that the antennas 214, the equalizers 218 and the modulation devices 222 are identical in form and function as the antenna 14, the equalizer 18 and the modulation device 22 described above in reference to FIG. 1.

The output of each modulation device 222 is passed through a directional coupler 240. The directional couplers 240 split the RF signals output from the respective modulation devices 222 into a first portion and a second portion. The first portion is output to RF power sensors 230. Each of the RF power sensors 230 are identical in form and function to the RF power sensor 30 described above in reference to FIG. 1. Each of the RF power sensors 230 is capable of measuring RF signals having very short durations. Thus, each RF power sensor 230 makes multiple time displaced, i.e. periodic, power level measurements of each pulsed RF signal first portions output from the respective directional coupler 240. In one preferred embodiment, the second portions are output to at least one frequency measurement device 244, e.g. a spectrum analyzer, that provides frequency measurements of the RF signals output from the modulation device 222.

A dual channel power meter 250 receives the peak RF signals output from each of the RF power sensors 230. Each channel of the RF power meter 250 independently determines the peak power level of any or all the RF signals input from the respective power sensor 230. Specifically, each channel of the dual channel RF power meter 250 independently determines the peak power level of at least the RF signal input from the respective power sensor 230 having the highest energy level, i.e. the peak RF signal. Additionally, the dual channel power meter 250 measures the shape and duration of each pulsed RF signal. The power meter 250 then converts the power levels of the signals, including the peak RF signal, into power units, e.g. Watts, and relative times. As with the RF power sensors 230, the power meter 250 is also capable of measuring RF signals having very short durations. These values are then output to the computer based device 238, which is identical in form and function as the computer based device 38 described above in reference to FIG. 1.

In another preferred embodiment the monitoring system 200 includes an indicator 254 that is in communication with the computer based device 238. The indicator 254 can be included in the computer based device 238, directly coupled to the computer based device 238 or wirelessly linked to the computer based device 238. The computer based device 238 activates the indicator 254 when the intensity of an E-field correlated to a peak RF signal exceeds the predetermined level. The indicator 254 can be any device or method suitable for indicating that the predetermined level has been exceeded. For example the indicator 254 can be an LED display connected to the computer based device 238, a pop-up message that is displayed on the computer based device 238, or an audible indication sounded by the computer based device. In another embodiment the computer based device 238 can be used to control the operation of the RF power meter 250. For example, the computer based device 238 can make time dependent changes to the setting of the RF power meter 250 to better measure E-field intensities that may vary with time.

Figure 4:
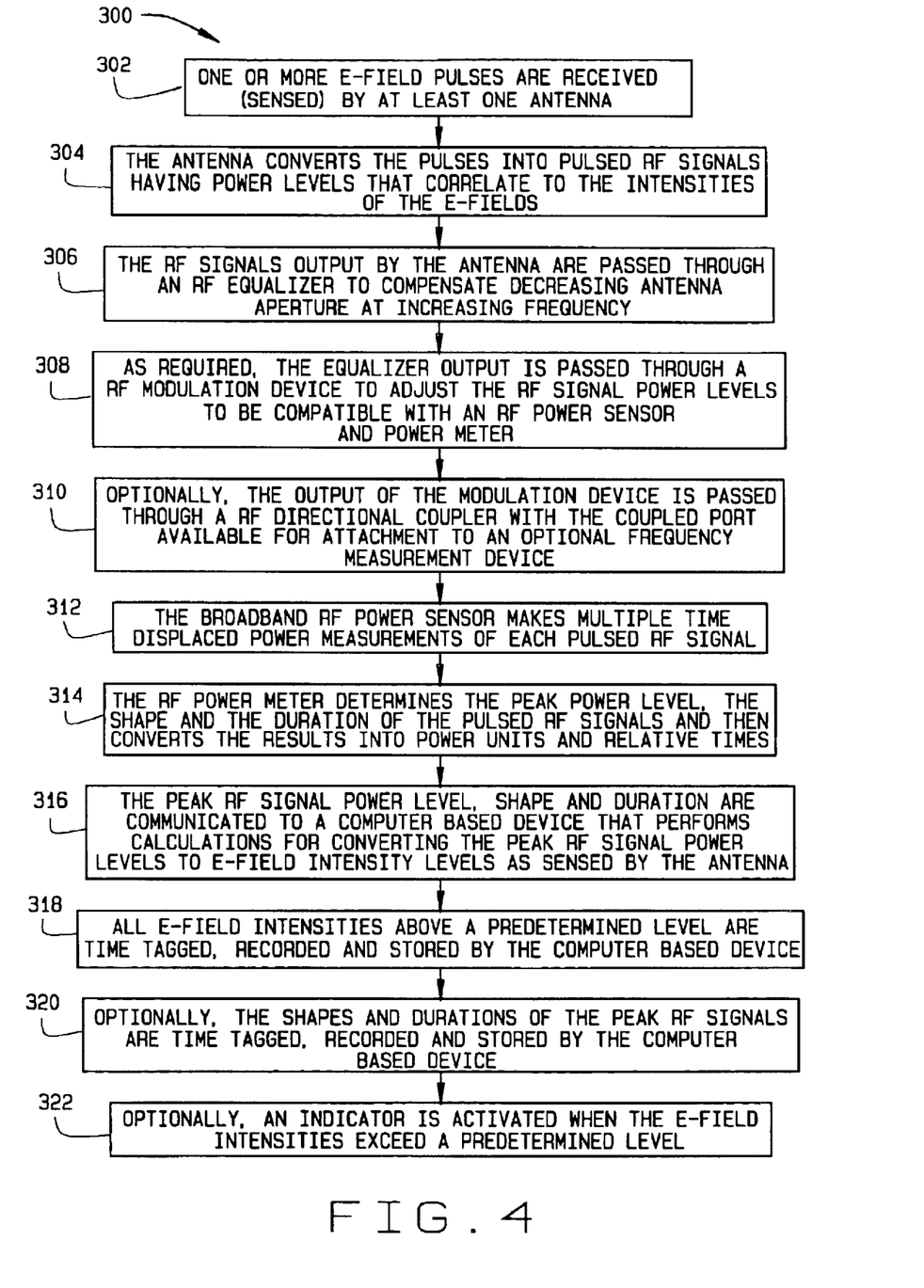
FIG. 4 is a flow chart of a method for monitoring E-fields utilizing the system shown in FIG. 1.

FIG. 4 is a flow chart 300 of a method for monitoring E-fields utilizing the system 10 shown in FIG. 1. One or more E-field pulses are received, i.e. sensed, by at least one antenna, as indicated at step 302. The antenna converts the pulses into pulsed RF signals having energy levels and frequencies that correlate to the intensities and frequencies of the E-fields, as indicated at step 304. The RF signals output by the antenna are passed through an equalizer, e.g. an RF equalizer, to normalize the signals to compensate for the variances in antenna aperture that occur with varying frequency of the sensed E-fields, as indicated at step 306. The equalizer outputs are modulated, via a modulation device, to a level compatible with a RF power sensor and a power meter, as indicated at step 308. Optionally, the output of the modulation device is passed through a directional coupler with the coupled port available for attachment to an optional frequency measurement device for frequency measurements, as indicated at step 310.

The RF power sensor makes multiple time displaced, i.e. periodic, power measurements of each pulsed RF signal output from the modulation device, as indicated at step 312. The RF power meter determines the peak power level, the shape and the duration of the pulsed RF signals and converts the results into power units and relative times, as indicated at step 314. The peak RF signal power level, shape and duration is communicated to a computer based device that performs calculations for converting the peak RF signal power into an E-field intensity level that correlates to the peak RF signal sensed by the antenna, as indicated at step 316. All E-field intensities above a predetermined level are time tagged, recorded and stored by the computer based device, as indicated at step 318. Also, in a preferred form, the shapes and durations of the peak RF signals are time tagged, recorded and stored by the computer based device, as indicated at step 320. In a further preferred form, an indicator is activated when the E-field intensities exceed a predetermined level, as indicated at step 322.

Generally, each combination of antenna, equalizer, modulation device and RF power sensor can be referred to as a channel. Although preferred embodiments of the monitoring system 10 have been illustrated and describe above to include one or two channels, it is envisioned that any number of channels can be employed and remain within the scope of the invention.

Thus, the E-field monitoring system described herein provides a system and method for substantially continuously sensing, measuring and recording the occurrence and intensity of single or multiple narrow pulsed E-fields having frequencies anywhere within a very broad frequency range. Such information is very useful in diagnosing anomalies in electronic equipment that is susceptible to corruption due to exposure to E-fields produced by high power RF emitters such as radars.

While the invention has been described in terms of various specific embodiments, those skilled in the art will recognize that the invention can be practiced with modification within the spirit and scope of the claims.

What is claimed is:

1. A system for monitoring an intensity of narrow pulsed electromagnetic fields (E-fields), said system comprising:

at least one antenna adapted to sense one or more pulses of the electromagnetic fields (E-fields) within a range of frequencies and convert the pulses into radio frequency (RF) signals having energy levels correlated to intensities of the E-fields;

at least one peak power measurement subsystem adapted to determine a peak power level of at least one peak RF signal and convert the peak power level to power units; and a computer based device adapted to utilize the power units output by the peak power measurement subsystem to determine the intensity of the E-field correlated with the peak RF signal.

2. The system of claim 1, wherein the system further comprises at least one equalizer adapted to normalize the energy levels of RF signals output from the antenna across the range of frequencies.

3. The system of claim 2, wherein the system further comprises at least one modulation device adapted to adjust the energy levels of the RF signals output by the equalizer and output the adjusted signals to the peak power measurement subsystem.

4. The system of claim 3, wherein the peak power measurement subsystem comprises at least one RF power sensor adapted to periodically measure the power level of each pulsed RF signal output from the modulation device.

5. The system of claim 4, wherein the peak power measurement subsystem further comprises at least one power meter adapted to determine the peak power level of the peak RF signal.

6. The system of claim 5, wherein the system comprise a plurality of channels and the power meter comprises a dual channel power meter.

7. The system of claim 6, wherein the channels comprise a first channel adapted to receive E-field pulses within a first frequency range and a second channel adapted to receive E-field pulses within a second frequency range.

8. The system of claim 5, wherein the power meter is further adapted to measure at least one of a shape and a duration of each pulsed RF signal.

9. The system of claim 8, wherein the power meter is further adapted to convert the power levels of each pulsed RF signal into power units.

10. The system of claim 3, wherein the system further comprises at least one directional coupler adapted to divide each RF signal output by the modulation device into a first portion and second portion and output the first portions to the peak power measurement subsystem.

11. The system of claim 10, wherein the system further comprises at least one frequency measurement device adapted to receive the second portions from the directional coupler and provide a frequency reading of the RF signals output by the modulation device.

12. The system of claim 1, wherein the peak power measurement subsystem is further adapted to measure RF signals across a range of frequencies.

13. The system of claim 1, wherein the antenna comprises an omni-directional antenna.

14. The system of claim 1, wherein the antenna comprises a uni-directional antenna.

15. The system of claim 1, wherein the computer based device is further adapted to:
determine whether the E-field intensity correlated to the peak RF signal exceeds a predetermined level; and
record data pertaining to the peak RF signal when the peak RF signal exceeds the predetermined level.

16. The system of claim 15, wherein the system further comprises an indicator in communication with the computer device, wherein the computer device is further adapted to activate the indicator when the intensity of the E-field correlated the peak RF signal exceeds the predetermined level.

17. The system of claim 1, wherein the system comprises two circularly polarized hemispherical antennas adapted to sense one or more E-fields within a range of frequencies and convert the E-fields into RF signals having energy levels correlated to intensities of the E-fields.

18. A method for substantially continuously monitoring an intensity of narrow pulsed electromagnetic fields (E-fields), said method comprising:

substantially continuously sensing one or more electromagnetic fields (E-fields) within a range of frequencies utilizing at least one antenna adapted to receive E-fields;
converting the E-fields into radio frequency (RF) signals having energy levels correlated to intensities of the E-fields utilizing the antenna;
determining a peak power level of at least one peak RF signal utilizing at least one peak power measurement subsystem;
converting the peak power level of the peak RF signal to power units utilizing the peak power measurement subsystem;
calculating the intensity of the E-field correlated with the peak RF signal based on the power units output by the peak power measurement subsystem utilizing a computer based device.

19. The method of claim 18, wherein the method further comprises normalizing the energy levels of RF signals output from the antenna across the range of frequencies utilizing at least one equalizer.

20. The method of claim 19, wherein the method further comprises:
adjusting the energy levels of the RF signals output by the equalizer utilizing at least one modulation device; and
outputting the adjusted signals to the peak power measurement subsystem.

21. The method of claim 20, wherein determining a peak power level of at least one peak RF signal comprises periodically measuring the energy levels of the RF signals output from the modulation device across the range of frequencies utilizing at least one RF power sensor included in the peak power measurement subsystem.

22. The method of claim 21, wherein determining a peak power level of at least one peak RF signal further comprises determining the peak power level of the peak RF signal utilizing at least one RF power meter included in the peak power subsystem.

23. The method of claim 21, wherein determining a peak power level of at least one peak RF signal further comprises periodically measuring a shape and a duration of each pulsed RF signal output from the modulation device.

24. The method of claim 22, wherein converting the peak power level to power units comprises converting the peak power level of the peak RF signal to power units utilizing the power meter.

25. The method of claim 20, wherein the method further comprises:
dividing each RF signal output from the modulation device into a first portion and second portion utilizing at least one directional coupler; and
outputting the first portions to the peak power measurement subsystem.

26. The method of claim 25, wherein the method further comprises:
outputting the second portions to at least one frequency measurement device; and
providing a frequency reading for RF signals output from the modulation device utilizing the frequency measurement device.

27. The method of claim 18, wherein substantially continuously sensing one or more E-fields comprises at least one of:
substantially continuously sensing one or more E-fields utilizing an omni-directional antenna; and substantially continuously sensing one or more E-fields utilizing a uni-directional antenna.

28. The method of claim 18, wherein the method further comprises:
   determining whether the E-field intensity correlated to the peak RF signal exceeds a predetermined level utilizing the computer based device; and
   recording data pertaining to the peak RF signal when the peak RF signal exceeds the predetermined level.

29. The method of claim 28, wherein the method further comprises activating an indicator, in communication with the computer device, when the intensity of the E-field correlated to the peak RF signal exceeds the predetermined level.

30. A system for monitoring an electromagnetic intensity of narrow pulses of electromagnetic fields (E-fields) having frequencies within a frequency range, said system comprising:
   at least one antenna adapted to sense one or more pulses of E-fields and convert the pulses into radio frequency (RF) signals having energy levels correlated to the intensities of the E-fields;
   at least one broadband equalizer adapted to normalize the energy levels of RF signals across the range of frequencies;
   at least one modulation device adapted to adjust the energy levels of the RF signals output by the broadband equalizer;
   at least one RF power sensor adapted to periodically measure a power level of each pulsed RF signal output from the modulation device;
   at least one power meter adapted to determine a peak power level of at least one peak RF signal that has the highest energy level and convert the peak power level of the peak RF signal to power units; and
   a computer based device adapted to utilize the power units output by the power meter to determine the intensity of the E-field correlated with the peak RF signal.

31. The system of claim 30, wherein the power meter is further adapted to measure at least one of a shape and a duration of each pulsed RF signal output from the modulation device.

32. The system of claim 30, wherein the system further comprises at least one directional coupler adapted to divide each RF signal output by the modulation device into a first portion and second portion and output the first portions to the RF power sensor.

33. The system of claim 32, wherein the system further comprises at least one frequency measurement device adapted to receive the second portions from the directional coupler and provide a frequency reading for RF signals output from the modulation device.

34. The system of claim 30, wherein the antenna comprises an omni-directional antenna.

35. The system of claim 30, wherein the antenna comprises a uni-directional antenna.

36. The system of claim 30, wherein the computer based device is further adapted to determine whether the E-field intensity correlated to the peak RF signal exceeds a predetermined level.

37. The system of claim 36, wherein the system further comprises an indicator in communication with the computer device, wherein the computer device is further adapted to activate the indicator when the intensity of the E-field correlated to the peak RF signal exceeds the predetermined level.

38. The system of claim 30, wherein the system comprises two circularly polarized hemispherical antennas adapted to sense one or more E-fields within a range of frequencies and convert the E-fields into RF signals having energy levels correlated to intensities of the E-fields.

39. A system for monitoring an intensity of narrow pulsed electromagnetic fields (E-fields), said system comprising:
   at least one antenna adapted to sense one or more pulses of electromagnetic fields (E-fields) within a range of frequencies and convert the pulses into electromagnetic (EM) wave signals having energy levels correlated to intensities of the E-fields; and
   a monitoring subsystem responsive to the EM wave signals for determining a peak power level of at least one received EM wave signal and, from the determined peak power level, determining a strength of the E-field corresponding to the determined peak power level of the received EM wave signal.

40. The system of claim 39, wherein the monitoring subsystem comprises at least one peak power measurement subsystem adapted to determine the peak power level of the EM wave signal and convert the peak power level to power units.

41. The system of claim 40, wherein the monitoring subsystem further comprises a computer based device adapted to utilize the power units output by the peak power measurement subsystem to determine the intensity of the E-field correlated with the peak EM wave signal.

42. A method for substantially continuously monitoring an intensity of narrow pulsed electromagnetic fields (E-fields), said method comprising:
   substantially continuously sensing one or more E-fields within a range of frequencies;
   converting the E-fields into electromagnetic (EM) wave signals having energy levels correlated to intensities of the E-fields;
   determining a peak power level of at least one peak EM wave signal;
   calculating the intensity of the E-field correlated with the peak EM wave signal.

43. The method of claim 42, wherein calculating the intensity of the E-field comprises:
   converting the peak power level of the peak EM wave signal to power units; and
   calculating the intensity of the E-field correlated with the peak EM wave signal based on the power units.

44. A system for monitoring an electromagnetic intensity of narrow pulses of electromagnetic fields (E-fields) having frequencies within a frequency range, said system comprising:
   at least one antenna adapted to sense one or more E-field pulses and convert the pulses into electromagnetic (EM) wave signals having energy levels correlated to the intensities of the E-fields;
   at least one power sensor adapted to periodically measure a power level of each EM wave signal output from the antenna;
   at least one power meter adapted to determine a peak power level of at least one peak EM wave signal that has the highest energy level and convert the peak power level of the peak EM wave signal to power units; and
   a computer based device adapted to utilize the power units output by the power meter to determine the intensity of the E-field correlated with the peak EM wave signal.

45. The system of claim 44, wherein the system further comprises at least one broadband equalizer adapted to normalize the energy levels of the EM wave signals from the antenna across the range of frequencies.

46. The system of claim 45, wherein the system further comprises at least one modulation device adapted to adjust the energy levels of the EM wave signals output by the broadband equalizer.

* * * * *